(12) United States Patent
Hsu et al.

(10) Patent No.: US 10,541,304 B2
(45) Date of Patent: Jan. 21, 2020

(54) METHOD FOR FABRICATING SEMICONDUCTOR DEVICE

(71) Applicant: UNITED MICROELECTRONICS CORP., Hsin-Chu (TW)

(72) Inventors: Chih-Kai Hsu, Tainan (TW); Ssu-I Fu, Kaohsiung (TW); Yu-Hsiang Hung, Tainan (TW); Wei-Chi Cheng, Kaohsiung (TW); Jyh-Shyang Jenq, Pingtung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/983,077

(22) Filed: May 17, 2018

(65) Prior Publication Data

US 2018/0269288 A1 Sep. 20, 2018

Related U.S. Application Data

(62) Division of application No. 15/259,060, filed on Sep. 8, 2016, now Pat. No. 10,008,569.

(30) Foreign Application Priority Data

Aug. 10, 2016 (TW) .............................. 105125383 A

(51) Int. Cl.
| | |
|---|---|
| *H01L 29/08* | (2006.01) |
| *H01L 29/78* | (2006.01) |
| *H01L 21/8238* | (2006.01) |
| *H01L 29/66* | (2006.01) |
| *H01L 27/092* | (2006.01) |
| *H01L 29/423* | (2006.01) |

(52) U.S. Cl.
CPC .. *H01L 29/0847* (2013.01); *H01L 21/823821* (2013.01); *H01L 27/0924* (2013.01); *H01L 29/42356* (2013.01); *H01L 29/42368* (2013.01); *H01L 29/66545* (2013.01); *H01L 29/66636* (2013.01); *H01L 29/66795* (2013.01); *H01L 29/78* (2013.01); *H01L 29/785* (2013.01); *H01L 29/7833* (2013.01); *H01L 29/7848* (2013.01); *H01L 29/665* (2013.01)

(58) Field of Classification Search
None
See application file for complete search history.

(56) References Cited

U.S. PATENT DOCUMENTS 9,293,534 B2 * 3/2016 Tsai .................... H01L 29/0847
2015/0318212 A1 11/2015 Tsai

OTHER PUBLICATIONS

Hsu, Title of Invention: Semiconductor Device Having a Cap Layer with V-Shape, U.S. Appl. No. 15/144,842, filed May 3, 2016.
Hsu, Title of Invention: Semiconductor Device and Method for Fabricating the Same, U.S. Appl. No. 14/961,902, filed Dec. 8, 2015.

* cited by examiner

*Primary Examiner* — Long Pham
(74) *Attorney, Agent, or Firm* — Winston Hsu

(57) ABSTRACT

A method for fabricating semiconductor device includes the steps of: providing a substrate; forming a gate structure on the substrate; forming a spacer adjacent to the gate structure; forming a recess adjacent to the spacer; forming a buffer layer in the recess, wherein the buffer layer comprises a crescent moon shape; and forming an epitaxial layer on the buffer layer.

10 Claims, 3 Drawing Sheets

METHOD FOR FABRICATING SEMICONDUCTOR DEVICE

CROSS REFERENCE TO RELATED APPLICATIONS

This application is a division of U.S. application Ser. No. 15/259,060 filed Sep. 8, 2016, and incorporated herein by reference in its entirety.

BACKGROUND OF THE INVENTION

1. Field of the Invention

The invention relates to a method for fabricating semiconductor device, and more particularly to a method of forming buffer layer with crescent moon shape.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, epitaxial layers serving as primary stress-inducing structure in non-planar metal-oxide semiconductor (MOS) transistors, such as fin field effect transistors (FinFET) today are difficult to obtain an even surface through the fabrication process, thereby affecting the performance of the device. Hence, how to improve the current fabrication to resolve this issue has become an important task in this field.

SUMMARY OF THE INVENTION

According to a preferred embodiment of the present invention, a method for fabricating semiconductor device is disclosed. First, a substrate is provided, a gate structure is formed on the substrate, a recess is formed adjacent to the gate structure, a buffer layer is formed in the recess, and an epitaxial layer is formed on the buffer layer. Preferably, the buffer layer includes a crescent moon shape.

According to another aspect of the present invention, a semiconductor device is disclosed. The semiconductor device includes: a substrate; a gate structure on the substrate; a buffer layer adjacent to the gate structure, and an epitaxial layer on the buffer layer. Preferably, the buffer layer includes a crescent moon shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
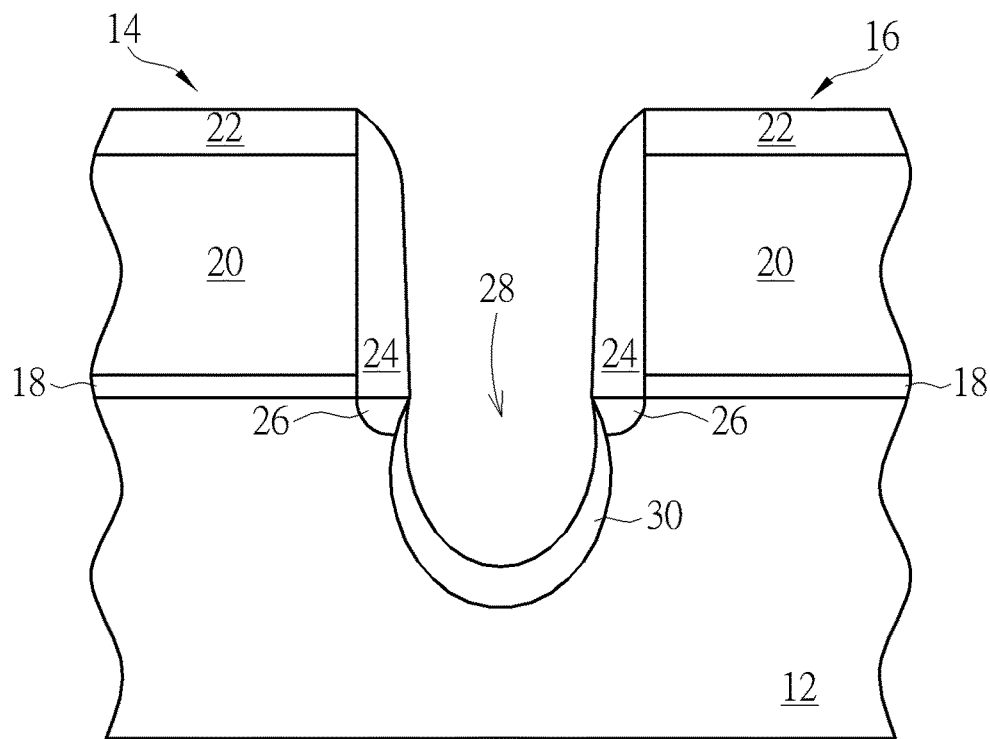
FIGS. 1-4 illustrate a method for fabricating semiconductor device according to a preferred embodiment of the present invention.

Referring to FIGS. 1-4, FIGS. 1-4 illustrate a method for fabricating semiconductor device according to a preferred embodiment of the present invention. As shown in FIG. 1, a substrate 12 is provided, and gate structures 14, 16 are formed on the substrate 12. In this embodiment, the formation of the gate structures 14, 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and then stripping the patterned resist. This forms gate structures 14 and 16 composed of patterned gate dielectric layer 18, patterned gate material layer 20, and patterned hard mask 22.

It should be noted that even though two gate structures 14, 16 are disclosed in this embodiment, the quantity or number of the gate structures 14, 16 is not limited to two, but could all be adjusted according to the demand of the product. Moreover, only part of the gate structures 14, 16, such as the right portion of the gate structure 14 and left portion of the gate structure 16 are shown in FIG. 1 to emphasize the formation of buffer layer and epitaxial layer between gate structures 14, 16 in later process.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material; the gate material layer 20 could include metal, polysilicon, or silicide; the material of hard mask 22 could be selected from the group consisting of $SiO_2$, SiN, SiC, and SiON.

In addition, in an embodiment, a plurality of doped wells or shallow trench isolations (STIs) could be selectively formed in the substrate 12. Despite the present invention pertains to a planar MOS transistor, it would also be desirable to apply the process of the present invention to non-planar transistors such as FinFET devices, and in such instance, the substrate 12 shown in FIG. 1 would become a fin-shaped structure formed atop a substrate 12.

Next, at least one spacer 24 is formed on the sidewalls of the gate structures 14 and 16. Optionally, after a lightly doped ion implantation processes is conducted, a rapid thermal annealing processes is performed at about 930° C. to active the dopants implanted in the substrate 12 for forming a lightly doped drain 26 in the substrate 12 adjacent to two sides of the spacer 24. In this embodiment, the spacer 24 could be a single or composite spacer, in which the spacer 24 could further include an offset spacer (not shown) and a main spacer (not shown). The offset spacer and the main spacer are preferably made of different material while the offset spacer and main spacer could all be selected from the group consisting of $SiO_2$, SiN, SiON, and SiCN, but not limited thereto.

Next, a dry etching and/or wet etching process is conducted by using the gate structures 14, 16 and spacers 24 as mask to remove part of the substrate 12 through single or multiple etching processes. This forms a recess 28 in the substrate 12 between gate structures 14, 16, and a buffer layer 30 is formed in the recess 28 thereafter.

In this embodiment, the formation of the buffer layer 30 could be accomplished by first conducting a deposition process to form a buffer layer 30 in the recess 28 between gate structures 14, 16 and at the same time conducting an etching process to remove part of the buffer layer 30. Preferably, a silicon-containing gas such as dichlorosilane (DCS) is injected during the deposition process to form the buffer layer 30 within the recess 28, and a chlorine-containing gas such as hydrochloric acid (HCl) is injected during the etching process to remove part of the buffer layer 30 as well as dislocations that may be formed within the buffer layer 30.

It should be noted that an etching to deposition ratio between the deposition gas (such as DCS) and etching gas (such as HCl) during the formation of the buffer layer 30 is controlled between 0.2 to 0.5, or most preferably at around 0.25, so that the top surface or tip of the buffer layer 30 is prevented to grow above the substrate 12 surface, out of the recess 28, and further extend upward to the sidewalls of the spacers 24. The top surface of epitaxial layer grown afterwards would also have a planar surface instead of a V-shaped profile, in which the planar surface of the epitaxial layer is preferably even with the substrate 12 surface. According to a preferred embodiment of the present invention, the buffer layer 30 formed through the aforementioned process preferably includes a crescent moon shape, in which the two tips of the crescent moon shape are preferably even with the substrate 12 surface without extending upward to the sidewalls of the spacers 24.

Figure 2:
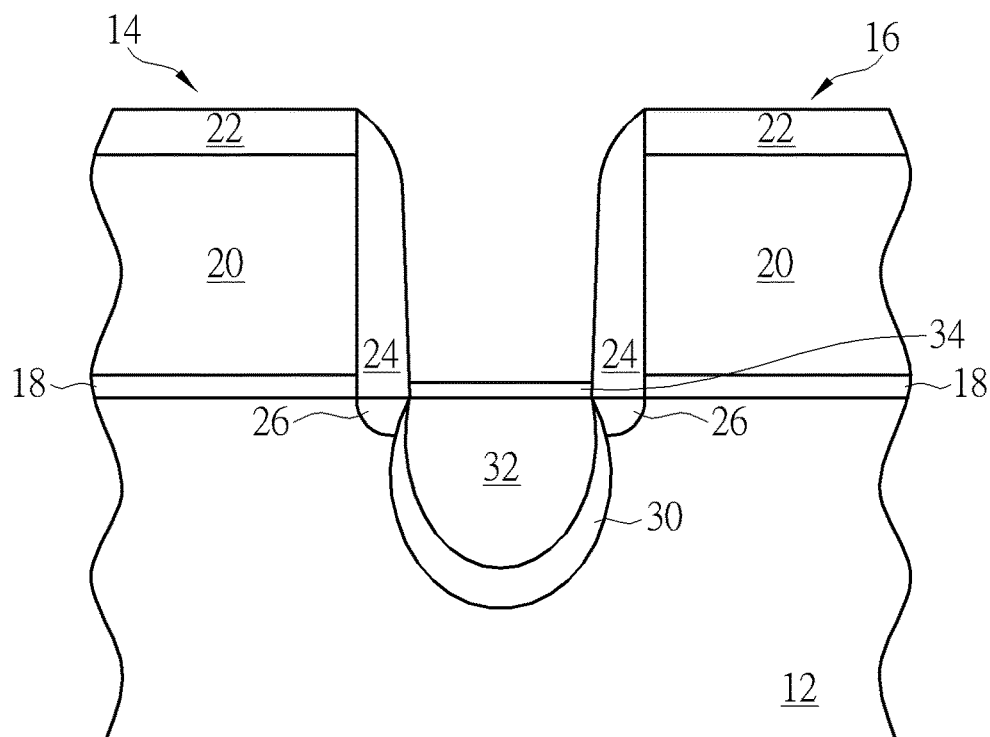

Next, as shown in FIG. 2, the aforementioned deposition process and etching process could be conducted repeatedly to form an epitaxial layer 32 on the buffer layer 30, in which dopants could be implanted within the epitaxial layer 32 to form source/drain region and the top surfaces of the epitaxial layer 32 and substrate 12 are preferably coplanar. Next, a cap layer 34 is formed on the epitaxial layer 32.

In this embodiment, the buffer layer 30, epitaxial layer 32 and the cap layer 34 preferably include silicon phosphide (SiP), in which a concentration of phosphorus in the epitaxial layer 32 is preferably higher than a concentration of phosphorus in the buffer layer 30 and a concentration of phosphorus in the cap layer 34 is preferably lower than a concentration of phosphorus in the epitaxial layer 32. In other words, the concentration of phosphorus in the epitaxial layer 32 is preferably higher than the concentration of phosphorus in both the buffer layer 30 and the cap layer 34 while the concentration of phosphorus in the buffer layer 30 and cap layer 34 is not be limited. For example, the concentration of phosphorus in the buffer layer 30 could be higher than the concentration of phosphorus in the cap layer 34, or the concentration of phosphorus in the cap layer 34 could be higher than the concentration of phosphorus in the buffer layer 30, which are all within the scope of the present invention.

Figure 3:
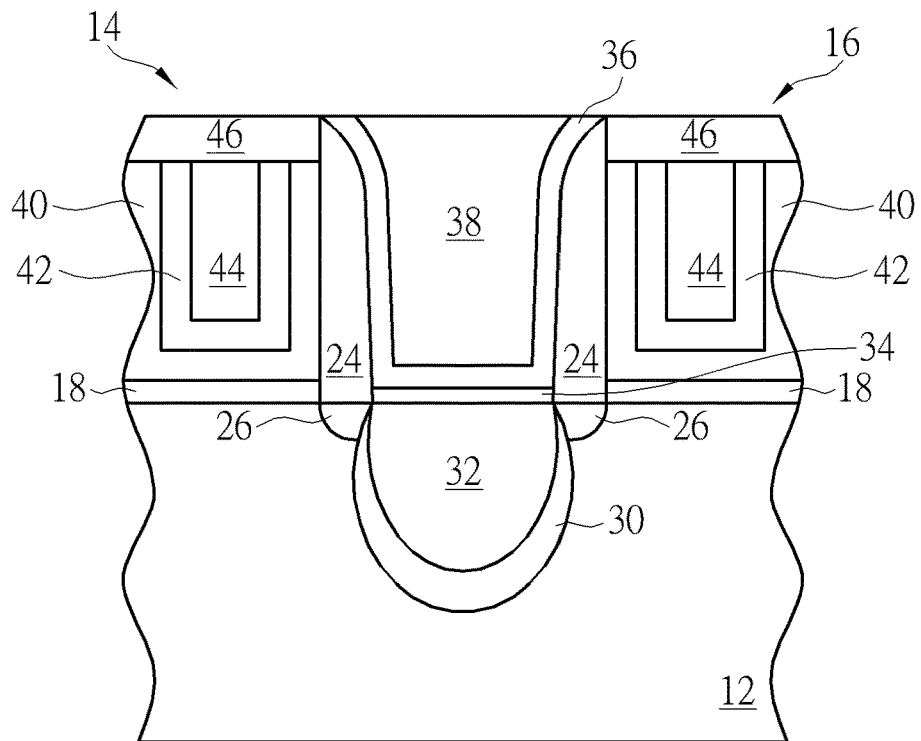

Next, as shown in FIG. 3, a contact etch stop layer (CESL) 36 made of silicon nitride could be formed on the substrate 12 to cover the gate structures 14, 16 and cap layer 34, and an interlayer dielectric (ILD) layer 38 is formed on the CESL 36. Next, a planarizing process, such as chemical mechanical polishing (CMP) process is conducted to remove part of the ILD layer 38, part of the CESL 36, and the hard masks 22 for exposing the gate material layer 20 made of polysilicon, so that the top surfaces of the gate material layer 20 and ILD layer 38 are coplanar.

Next, a replacement metal gate (RMG) process is conducted to transform the gate structures 14, 16 into metal gates. The RMG process could be accomplished by first performing a selective dry etching or wet etching process, such as using etchants including ammonium hydroxide ($NH_4OH$) or tetramethylammonium hydroxide (TMAH) to remove the gate material layer 20 from gate structures 14, 16 for forming recesses (not shown) in the ILD layer 38. Next, a high-k dielectric layer 40 and a conductive layer including at least a U-shaped work function metal layer 42 and a low resistance metal layer 44 are formed in the recesses, and a planarizing process is conducted so that the surfaces of the U-shaped high-k dielectric layer 40, U-shaped work function metal layer 42, low resistance metal layer 44, and ILD layer 38 are coplanar.

In this embodiment, the high-k dielectric layer 40 is preferably selected from dielectric materials having dielectric constant (k value) larger than 4. For instance, the high-k dielectric layer 40 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 42 is formed for tuning the work function of the later formed metal gates to be appropriate in an NMOS or a PMOS. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. Next, part of the high-k dielectric layer 40, part of the work function metal layer 42, and part of the low resistance metal layer 44 are removed to form recesses (not shown), and hard masks 46 are formed in the recesses so that the top surfaces of the hard masks 46 and ILD layer 38 are coplanar. The hard masks 46 could be selected from the group consisting of silicon oxide, silicon nitride, silicon oxynitride, and silicon carbon nitride.

Figure 4:
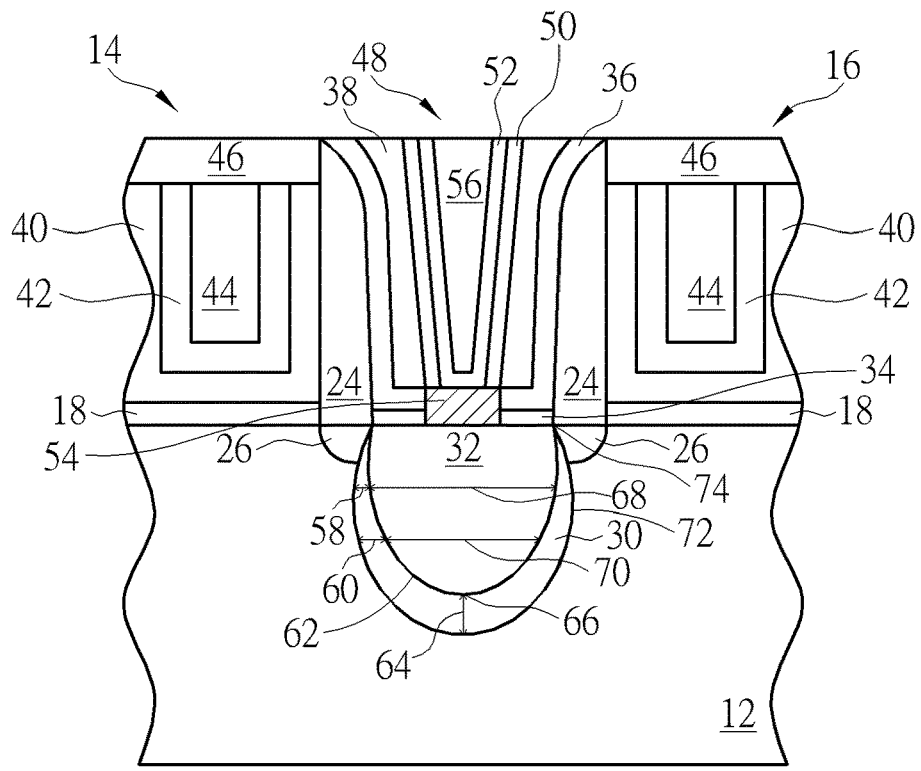

Next, as shown in FIG. 4, a contact plug formation is conducted with silicide process to form a silicide 54 on the cap layer 34 surface and a contact plug 48 electrically connected to the source/drain region and epitaxial layer 32 adjacent to two sides of the gate structures 14, 16. In this embodiment, the contact plug formation could be accomplished by first conducting an etching process to remove part of the ILD layer 38 between gate structures 14, 16 to form a contact hole (not shown) exposing the cap layer 34 surface. Next, a first metal layer 50 and a second metal layer 52 are deposited in sequence in the contact hole, in which the first metal layer 50 and the second metal layer 52 are formed conformally on the surface of the cap layer 34 and inner sidewalls of the contact hole. In this embodiment, the first metal layer 50 is selected from the group consisting of Ti, Co, Ni, and Pt, and most preferably Ti, and the second metal layer 52 is selected from the group consisting of TiN and TaN.

After depositing the first metal layer 50 and second metal layer 52, a first thermal treatment process and a second thermal treatment process are conducted sequentially to form a silicide 54 on the epitaxial layer 32. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a third metal layer 56 is deposited to fill the contact hole completely. In this embodiment, the third metal layer 56 is composed of tungsten, but not limited thereto. Next, a planarizing process, such as a CMP process is conducted to remove part of the third metal layer 56, part of the second metal layer 52, and part of the first metal layer 50, and depending on the demand of the process also removing part of the ILD layer 38 for forming a contact plug 48 electrically connected to the cap layer 34 and epitaxial layer 32. This completes the fabrication of a semiconductor device according to a preferred embodiment of the present invention.

Referring to FIG. 4, which further illustrates a structural view of a semiconductor device according to a preferred embodiment of the present invention. As shown in FIG. 4, the semiconductor device includes at least a gate structure 14 on the substrate 12, a spacer 24 adjacent to the gate structure 14, a buffer layer 30 in the substrate 12 adjacent to two sides of the spacer 24, and an epitaxial layer 32 on the buffer layer 30.

Specifically, the buffer layer 30 includes a crescent moon shape, in which the crescent moon shape further includes a first width 58 and a second width 60 directly under the spacer 24, and the second width 60 being greater than the first width 58. In this embodiment, the first width 58 is preferably between 3 nm to 7 nm or most preferably at 5 nm, and the second width 60 is preferably between 5 nm to 9 nm or most preferably at 7 nm. Viewing from a more detailed angle, the crescent moon shape of the buffer layer 30 includes an inner curve 62 and an outer curve 72, in which the inner curve 62 and the outer curve 72 cross at two points 74 adjacent to two sides of the epitaxial layer 32 and a line connected by the two points 74 is preferably even with the substrate 12 surface.

In addition, a bottom surface of the epitaxial layer 32 includes a curve or the inner curve 62 of the buffer layer 30, the buffer layer 30 includes a vertical thickness 64 directly under a valley point 66 of the curve 62. The epitaxial layer 32 also includes a width 68 substantially equivalent to a width of the recess 28 along an X-direction and another width 70 slightly less than the width 68. In this embodiment, the vertical thickness 64 of the buffer layer 30 is preferably between 7 nm to 11 nm or most preferably at 9 nm, the width 68 of the epitaxial layer 32 is between 32 nm to 35 nm or most preferably at 33.5 nm, and the width 70 is preferably between 28 nm to 31 nm or most preferably at 29.5 nm.

Figure 5:
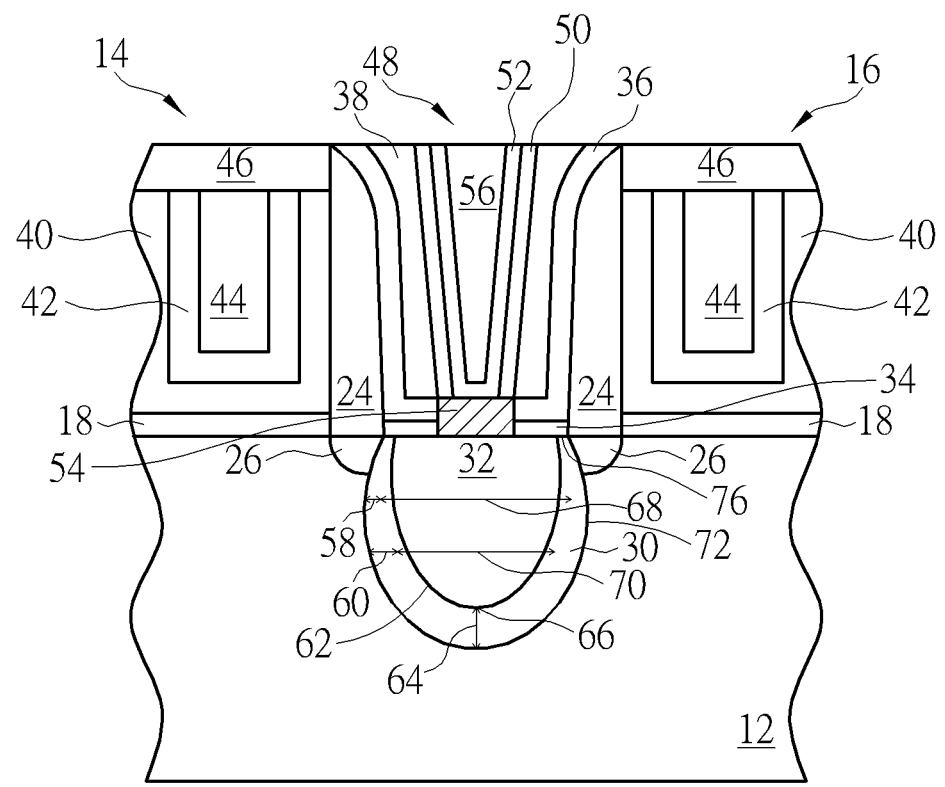
FIG. 5 illustrates a structural view of a semiconductor device according to an embodiment of the present invention.

Referring to FIG. 5, FIG. 5 illustrates a structural view of a semiconductor device according to an embodiment of the present invention. As shown in FIG. 5, in contrast to the inner curve 62 and the outer curve 72 cross at points 74 on two sides of the epitaxial layer 32 shown in FIG. 4, it would also be desirable to not crossing the inner curve 62 and outer curve 72 of the buffer layer 30. Instead, the inner curve 62 and the outer curve 72 would connect to a planar surface 76 at the same time while the surface 76 is even with the surface of the substrate 12.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate;
    forming a gate structure on the substrate;
    forming a recess adjacent to the gate structure;
    forming a buffer layer in the recess, wherein the buffer layer comprises a crescent moon shape, the buffer layer comprises an inner curve and an outer curve intersect on a top surface of the substrate, and each of the inner curve and the outer curve comprises a completely curved surface; and
    forming an epitaxial layer on the buffer layer.

2. The method of claim 1, further comprising:
    forming a spacer adjacent to the gate structure; and
    forming the recess adjacent to the spacer.

3. The method of claim 2, wherein the buffer layer comprises a first width and a second width directly under the spacer, wherein the second width is greater than the first width.

4. The method of claim 3, wherein the first width is between 3 nm to 7 nm.

5. The method of claim 3, wherein the second width is between 5 nm to 9 nm.

6. The method of claim 1, wherein a bottom surface of the epitaxial layer comprises a curve.

7. The method of claim 6, wherein the buffer layer comprises a vertical thickness directly under a valley point of the curve.

8. The method of claim 7, wherein the vertical thickness is between 7 nm to 11 nm.

9. The method of claim 1, wherein a top surface of the epitaxial layer is even with a top surface of the substrate.

10. The method of claim 1, wherein an etching to deposition ratio of the buffer layer is between 0.2 to 0.5.

* * * * *